(12) United States Patent
Cox

(10) Patent No.: US 6,214,651 B1
(45) Date of Patent: Apr. 10, 2001

(54) DOPED DIAMOND FOR VACUUM DIODE HEAT PUMPS AND VACUUM DIODE THERMIONIC GENERATORS

(75) Inventor: Isaiah Watas Cox, London (GB)

(73) Assignee: Borealis Technical Limited (GI)

(*) Notice: Subject to any disclaimer, the term of this patent is extended or adjusted under 35 U.S.C. 154(b) by 0 days.

(21) Appl. No.: 09/436,913

(22) Filed: Nov. 9, 1999

Related U.S. Application Data

(62) Division of application No. 08/650,623, filed on May 20, 1996, now Pat. No. 5,981,071.

(51) Int. Cl.⁷ .......................................... B05D 5/12

(52) U.S. Cl. .............................. 438/141; 427/77

(58) Field of Search ................. 438/141; 427/77

(56) References Cited

U.S. PATENT DOCUMENTS

| | | | |
|---|---|---|---|
| 4,869,923 | * 9/1989 | Yamazaki | 427/249 |
| 5,094,915 | * 3/1992 | Subramaniam | 428/408 |
| 5,238,705 | * 8/1993 | Hayash et al. | 427/249 |
| 5,283,501 | * 2/1994 | Zhu . | |
| 5,463,271 | * 10/1995 | Geis et al. | 313/310 |
| 5,474,816 | * 12/1995 | Falabella . | |
| 5,578,901 | * 11/1996 | Blanchet-Fincher et al. | 313/496 |
| 5,602,439 | * 2/1997 | Valone | 313/310 |
| 5,616,179 | * 4/1997 | Baldwin et al. | 204/192.11 |

* cited by examiner

*Primary Examiner*—Archene Turner

(57) ABSTRACT

A novel use of doped carbonaceous material is disclosed, integral to the operation of Vacuum Diode Heat Pumps and Vacuum Diode Thermionic Generators. In the preferred embodiment, the use of nitrogen-doped diamond enhances the operation of Vacuum Diode Heat Pumps and Vacuum Diode Thermionic Generators.

20 Claims, No Drawings

DOPED DIAMOND FOR VACUUM DIODE HEAT PUMPS AND VACUUM DIODE THERMIONIC GENERATORS

REFERENCE TO RELATED APPLICATIONS

This application is a Divisional of U.S. application Ser. No. 08/650,623, filed on May 20, 1996 and issued as U.S. Pat. No. 5,981,071, on Nov. 9, 1999.

BACKGROUND

Field of Invention

The present invention is related to cold cathode technology, and in particular a new use for Nitrogen-doped Chemical-Vapor-Deposited Diamond as a means of enhancing the performance of previously disclosed Vacuum Diode Heat Pumps and Vacuum Diode Thermionic Converters.

Background—Electron Devices

All vacuum electron devices require a physical source of electrons in the form of a cathode. Traditionally, cathodes for vacuum tubes and cathode ray tubes use thermionic emission to produce the electrons. This requires raising cathode materials to very high temperatures either by direct conduction of current or through the use of auxiliary heaters. The process is inefficient, requiring relatively high currents and dissipating much energy as heat to the surrounding area.

Recently, there has been substantial investigation of replacements for the heated thermionic cathodes. Specifically, "cold cathode" devices have attracted much attention. These cathodes may be very efficient because they eliminate the need to heat the cathode material. There are three types of cold cathode known to the art. In the field emission type of cold cathode device, electrons are emitted from the tip of an emitter cone. In the tunnel type of cold cathode device, electrons pass through a thin insulating film by the tunneling effect. In the avalanche type of cold cathode device, the electrons emitted are a fraction of a current that flows through a reverse biased p-n junction of a diode oriented such that the junction is parallel to the surface of the emitter.

While these cold cathode structures can be made in almost any size and may have many applications as single units, their best performance and major application is expected to come from extreme miniaturization, in dense structures.

Cold cathode structures are useful electron sources for applications such as flat panel displays, vacuum microelectronic devices, amplifiers, and electron microscopes. Additional electrodes may be, and commonly are, used to collect and/or control the electron current. This technology is presently undergoing extensive development, with many articles being published and numerous patents being issued. Work in the art has been focused on the development of better emissive structures and materials, the use of such devices in electronic applications, and enhanced methods of fabricating such devices as well as fabricating integrated devices.

Background—Thermionic Emissions

All material may be characterized by a "work function." The work function is the quantity of energy required to move a single electron from the conduction band of a neutral sample of the material to free vacuum. Generally the work function is measured in electron volts. This work function may be considered a potential barrier to the escape of electrons from the material. A similar measure used to describe insulating materials is called "Electron Affinity," so called because the conduction band of insulators is not occupied, and thus needs to be populated before a work function can be measured.

Electrons within materials may only occupy restricted energy bands, such as the low energy 'valence' band and the higher energy 'conduction' band in an insulator. In metals, the valence band is partially occupied, and thus forms the conduction band. In insulators, the valence band is fully occupied, and thus cannot conduct, and the next higher band forms the conduction band, but has no electrons in it and again cannot conduct. In semiconductors, the energy difference between the valence band and the conduction band is small enough that electrons may be 'promoted' to the conduction band, allowing some conduction.

Electrons are emitted from the highest occupied band, the conduction band. It is well known that dopant materials may be used to introduce electrons into the conduction band (N type doping) or to remove electrons from the valence band (P type doping). Higher temperatures will increase the number of electrons promoted to higher energy levels.

Where a material possesses a negative electron affinity, such that the bottom of the electronic conduction band lies above the 'vacuum band'—the energy of a free electron in a vacuum—electrons can escape spontaneously from the material if they are promoted to the conduction band. These low or negative work function materials thus have the potential to act as cold cathodes.

The conduction band electrons of a conductor exhibits a distribution in kinetic energy, much as the individual molecules of a gas move at widely varying speeds. Some fraction of the electrons present in the conduction band of the conductor will be moving at such a speed and in such a direction that they may overcome the potential barrier of the work function, and escape the conductor. Positing a lone conductor in space, the escaping electrons will cause a negative charge to be built up in the region surrounding the conductor, while the conductor acquires a positive charge.

With negative electron affinity materials, all electrons in the conduction band are capable of escaping to vacuum. However, in this case, the electrons in the band which donates electrons to the conduction band will demonstrate a distribution of kinetic energies, and only a fraction will be able to overcome the potential barrier to the conduction band.

When additional circuit elements are added and an external electric field is applied, a current can be caused to flow; electrons escape from the cathode, are carried by the electric field to the anode, and are then carried back to the cathode via a conductor. If the source of electric potential is part of the return circuit, then the device is a standard vacuum diode. If the load is additionally part of the return circuit, then it is a vacuum thermionic converter, using the heat applied to the cathode in order to produce an electric current flow. This device is well known in the art.

Background—Thin Film Diamond

The desirability of materials with negative electron affinity has already been discussed. One such material is diamond. The conduction band for diamond is of high energy, depending upon impurities and crystal orientation, above vacuum energy, enabling the spontaneous emission of electrons. Methods for depositing a diamond film by high current density DC glow discharge are known in the art. These methods are capable of both forming a uniform positive column between a deposition cathode and a substrate, and keeping the positive column stable for a long time, thereby synthesizing a thick, high quality, large-area diamond film.

The technology of carbonaceous films is also disclosed in a patent titled "Fabrication of Amorphous Diamond Films," by Steven Falabella, patent issue date: Dec. 12, 1995 U.S. Pat. No. 5,474,816. This patent discloses a method for coating a substrate with an amorphous diamond film by cooling a substrate; biasing the substrate: and condensing carbon ions thereon.

The object of this method is to reduce the intrinsic stress of amorphous diamond, in order to make it possible to provide a more durable coating in order to enhance the lifetime objects coated with the amorphous diamond. This method is disclosed as being important as a solid lubricant, in order to prevent or delay the failure of mechanical system.

The technology of low work-function cathodes is further disclosed in a patent titled "Electron Device Employing a Low/Negative Electron Affinity Electron Source," by Xiaodong T. Zhu, et al., patent issue date Feb. 1, 1994, U.S. Pat. No. 5,283,501. They disclose the use of an electron source formed of a layer of single crystal diamond material in having a low or negative work-function cathode.

Background—Nitrogen-Doping of Thin Film Diamond Cathode Surfaces

It has been shown that diamond is a suitable material for the construction of surfaces which allow electrons to escape spontaneously from the surface of a cathode. However, in pure diamond the conduction band is empty and the material is an insulator. In order to cause electron emission, very high potential differences must be applied to reach the threshold at which emissions may be expected to occur.

For practical purposes it is clearly desirable to reduce the required threshold voltage. The threshold voltage may be reduced by introducing a second material to, or doping, the diamond in order to donate electrons to the diamond conduction band. A number of substances have been proposed as possible candidates for doping the diamond in this way.

In the journal Applied Physics, Letters, Vol 67, 1328, (1995) M W Gets et al identified boron, phosphorus and nitrogen as possible donor materials. Of these, Gets identified nitrogen doping as potentially the most efficient, readily donating electrons to the conduction band and thus reducing the required threshold voltage by the greatest degree. However, literature states that it has proved difficult to introduce the nitrogen into the diamond film in sufficiently high concentrations to take advantage of this property.

In an article in the journal Nature, Vol 381, pp. 140–141, May 9, 1996, Ken Okano, Satoshi Koizumi, S Ravi, P Silva and Gehan A J Amaratunga disclose a solution to this problem wherein high concentrations of nitrogen can be incorporated into diamond films by using urea as the gaseous nitrogen source.

Quoting from Okano: Doped diamond films were grown using the hot-filament chemical-vapor-deposited technique under an atmosphere of acetone and hydrogen. Experimental samples were mounted as cathodes in a vacuum system, with an anode placed above the cathode, and the emissions current was measured against the anode voltage. The experiments indicated a threshold field of 0.5V $\mu m^{-1}$ which is considerably lower than previously reported threshold voltages for any other type of diamond except caesium-coated diamond.

In the preferred embodiment of the present invention, the method of Okano is used as described in his paper. A doped diamond film is grown using the hot-filament chemical-vapor-deposited technique under an atmosphere of acetone and hydrogen. A saturated solution of urea $((NiI_2)_2CO)$ and methanol $(CH_3OYH)$ is diluted to 1/10 with acetone $((CH)_3 CO)$, and vaporized to be used as the reactant gas.

In none of the articles and patents cited above are nitrogen-doped diamond films identified as of potential use in the construction of a vacuum diode heat pump, or a vacuum thermionic converter.

Background—Vacuum Diode Heat Pump and Vacuum Thermionic Generator

In Jonathan Edelson's application for a Method and Apparatus for a "Vacuum Diode Heat Pump With Thin Film Ablated Diamond Field Emission," application Ser. No. 08/580,282, Filed Dec. 27, 1995, the use of thin carbonaceous films as a viable surface for the cathode of a vacuum diode heat pump was disclosed. This device utilizes the electron flow between cathode and anode as a 'working fluid' whereby heat may be pumped from the cathode to the anode where it may then be discharged.

In Rodney Cox's application for a "Method and Apparatus for a Vacuum Thermionic Converter With Thin Film Carbonaceous Field Emission," application Ser. No. 08/610, 599, Filed Mar. 6, 1996 the use of thin carbonaceous films was likewise disclosed as suitable for use in the construction of a thermionic generator, in which the electron flow resulting from cold cathode emissions is used to generate electricity from the temperature differential between cathode and anode.

However, in neither the Edelson nor the Cox disclosures referred to above is nitrogen doping mentioned as a possible stage in the construction of the cathode surfaces, or as a possible improvement to the efficiency of the devices. The use of doped diamond films will enhance the efficiency of the above described devices.

The present invention therefore represents a novel use for nitrogen-doped chemical-vapor-deposited diamond (described by Okano) in the field of vacuum diode heat pumps and vacuum thermionic generators (disclosed by Edelson and Cox).

BRIEF DESCRIPTION OF INVENTION

The present invention is a new use for nitrogen-doped diamond films whereby these films are used for the pumping of heat, or the generation of electricity by way of thermionic emission. The film developed by Okano is used to form the electrodes in the devices disclosed by Edelson and Cox. The present invention is more generally the application of doping to the electrode materials of these devices.

OBJECTIVES AND ADVANTAGES

In addition to the objects and advantages of the methods of constructing and using cold cathodes in heat pumps and thermionic generators described in the above mentioned patents of Jonathan Edelson and Rodney Cox, objects and advantages of the present invention are as follows:

An advantage of the present invention is that it allows for a lower threshold voltage for the emission of electrons from diamond coated cathodes in heat pumps.

Accordingly it is an object of the present invention to reduce the voltage required for the successful operation of vacuum diode heat pumps.

An advantage of the present invention is that it allows for a lower threshold voltage for the emission of electrons from diamond coated cathodes in thermionic generators.

Accordingly it is an object of the present invention to reduce the voltage required for the successful operation of thermionic generators.

Another advantage of the present invention is that it enables a specific and available material to be used in the construction of a vacuum diode heat pump.

Accordingly it is an object of the present invention to identify a suitable material for the construction of electrodes in a vacuum diode heat pump.

Another advantage of the present invention is that it enables a specific and available material to be used in the construction of a thermionic generator.

Accordingly it is an object of the present invention to identify a suitable material for the construction of electrodes in a thermionic generator.

Still further objects and advantages will become apparent from a consideration of the ensuing description.

DESCRIPTION OF THE INVENTION

The operation of the vacuum electronic devices identified herein is well described in the prior art, and does not need to be repeated here, as this application is a new and beneficial use for a given material in a device well disclosed in the prior art.

The present invention discloses a novel use for the material and method of doping chemical-vapor-deposited diamond films identified by Okano et al referenced above, by applying principles of this method to the construction of electrodes for use in vacuum diode heat pumps and thermionic generators.

It should be noted that in other embodiments of the present invention, nitrogen may be delivered in a different compound than urea, and other substances than methanol may be used to carry the dopant. Likewise a different dilutant to acetone may be used as the carbon source.

In yet further embodiments, the diamond may be doped with materials other than nitrogen. For example, in one possible embodiment, phosphorus might be used to dope the diamond film. The expected electron emissions will be lower, but other advantages may present themselves for the use of phosphorus, or other donor materials, for specific embodiments.

In the method of Okano, the diamond films are grown on substrates scratched with diamond paste to give a high enough nucleation density for growth of a continuous film. In further embodiments of the present invention, a grain size of less than 1 $\mu$m may be found practical for the diamond paste, but other granularities may be conceived for other embodiments, or the nucleation material may be omitted entirely. It is conceived that the smaller the grain size, the more efficient the heat pump or thermionic generator will be. In another embodiment, nucleation is encouraged by means other than diamond paste.

The cathode so constructed may then be used, with the addition of spacers and an anode, according to the methods and devices described in the previously referenced patents of Jonathan Edelson and Rodney Cox, as a component in the construction of vacuum diode heat pumps or thermionic generators, resulting in an improved voltage threshold for the operation of these devices.

It should be noted that the anode may, for the purpose of the preferred embodiment, be constructed according to a similar method and with a similar material to that of the present invention. It may also, in other embodiments be constructed with a different, low-work-function material.

It should be noted that the above description represents a single embodiment of the invention, but that many embodiments are possible, for example, by applying the given techniques to avalanche or tunnel diodes, to triodes, or in varying the materials, spacing and scale of materials and elements envisaged.

SUMMARY, RAMIFICATIONS, AND SCOPE

It may be seen from the above description that this use of nitrogen-doped chemical-vapor-deposited diamond film for low-work function cathodes for use in vacuum diode heat pumps and thermionic generators is novel and beneficial.

In addition, the above description makes it possible to construct vacuum diode heat pumps and thermionic generators wherein a lower voltage threshold is required to facilitate electron emission than was previously known.

In the preferred embodiment described above, urea is used as the compound material which delivers the nitrogen to the diamond film. It is also possible to envisage the use of other compounds to deliver the nitrogen, and other materials than nitrogen to be delivered.

In a further group of possible embodiments, it is possible to envisage the use of other techniques for fabricating the thin film of diamond or diamond-like material, other than the techniques described. Other techniques include but are not limited to: application by high current density DC glow discharge; application by cooling a substrate, biasing the substrate, and condensing carbon ions upon the substrate; application by dip-coating the substrate in a carbon-particle-laden mixture; application by spraying all or part of the surface of the substrate with a carbon-particle-laden mixture; application by jet application on the substrate with a carbon-particle-laden mixture; application by ion beam deposition; application by plasma enhanced chemical vapor deposition; and application by sputter deposition.

In addition to the doped carbonaceous materials disclosed in the foregoing description, doped type ii-b diamond, doped amorphic diamond, doped cherical vapor deposited polycrystalline diamond films, doped hydrogenated carbon, doped amorphous diamond film, doped amorphous diamond, doped ablated diamond, doped diamond material, doped carbon material, doped non-crystalline carbon material, doped carbonaceous aluminum nitride material, doped carbonaceous material with geometric discontinuities exhibiting radii of curvature of less than approximately 1000 Å, and a doped carbonaceous material with a plurality of electron sources each formed of a single crystal diamond material may also be used.

Nitrogen doping of the carbonaceous material is disclosed in the foregoing: compounds of oxygen, carbon, hydrogen, phosphorus, boron, and cesium may also be used.

Although the description above contains many specificities, these should not be construed as limiting the scope of the invention but as merely providing illustrations of some of the presently preferred embodiments of this invention.

Thus the scope of the invention should be determined by the appended claims and their legal equivalents, rather than by the examples given.

I claim:

1. A method for making a vacuum diode comprising:
   providing a collector; and
   providing an emitter, wherein at least one of said collector or said emitter comprises a doped carbonaceous material to reduce a threshold voltage for the emission of electrons from said at least once of said collector or said emitter.

2. The method of claim 1, further comprising:

thermally coupling said collector to a mass to be heated; and thermally coupling said emitter to a mass to be cooled.

3. The method of claim 1, wherein said vacuum diode is a vacuum diode heat pump or a thermionic converter.

4. The method of claim 1, wherein said doped carbonaceous material comprises at least one of the following: doped type ii-b diamond, doped amorphic diamond, doped chemical-vapor-deposited polycrystalline diamond films, doped hydrogenated carbon, doped amorphous diamond film, doped amorphous diamond, doped ablated diamond, doped diamond, doped carbon, doped non-crystalline carbon, or doped carbonaceous aluminum nitride.

5. The method of claim 1, wherein said doped carbonaceous material comprises a doped carbonaceous material comprising geometric discontinuities exhibiting radii of curvature of less than 1000 Å.

6. The method of claim 1, wherein said doped carbonaceous material comprises a doped carbonaceous material having a plurality of electron sources each formed of a single crystal diamond material.

7. The method of claim 1, wherein said doped carbonaceous material comprises a carbonaceous material doped with a compound comprising at least one of the following: oxygen, nitrogen, carbon, hydrogen, phosphorus, boron, or cesium.

8. The method of claim 1, wherein said doped carbonaceous material comprises a carbonaceous material doped with urea $(NH_2)_2CO$.

9. A method for using a vacuum diode comprising:

providing a vacuum diode comprising an emitter and a collector, wherein at least one of said emitter or said collector comprises a doped carbonaceous material;

thermally coupling a collector in said vacuum diode to a mass to be heated;

thermally coupling an emitter in said vacuum diode to a mass to be cooled; and causing a current to flow from said emitter to said collector.

10. The method of claim 9, wherein said vacuum diode is a vacuum diode heat pump or a thermionic converter.

11. The method of claim 9, wherein said doped carbonaceous material comprises at least one of the following: doped type ii-b diamond, doped amorphic diamond, doped chemical-vapor-deposited polycrystalline diamond films, doped hydrogenated carbon, doped amorphous diamond film, doped amorphous diamond, doped ablated diamond, doped diamond, doped carbon, doped non-crystalline carbon, or doped carbonaceous aluminum nitride.

12. The method of claim 9, wherein said doped carbonaceous material comprises a carbonaceous material doped with at least one of the following: oxygen, nitrogen, carbon, hydrogen, phosphorus, boron, or cesium.

13. The method of claim 9, wherein said doped carbonaceous material comprises a carbonaceous material doped with urea $(NH_2)_2CO$.

14. The method of claim 9, wherein said doped carbonaceous material comprises a doped carbonaceous material comprising geometric discontinuities exhibiting radii of curvature of less than 1000 Å.

15. The method of claim 9, wherein a threshold voltage for the emission of electrons in said vacuum diode is reduced.

16. A method for reducing the threshold voltage for the emission of electrons in an electrode, said method comprising the steps of:

doping a carbonaceous material; and providing an electrode comprising a collector thermally coupled to a mass to be heated or an emitter thermally coupled to a mass to be cooled, wherein said electrode comprises said doped carbonaceous material, wherein a threshold voltage for the emission of electrons in said electrode is reduced.

17. The method of claim 16, wherein said vacuum diode is a vacuum diode heat pump or a thermionic converter.

18. The method of claim 16, wherein said doped carbonaceous material comprises a carbonaceous material doped with at least one of the following: oxygen, nitrogen, carbon, hydrogen, phosphorus, boron, or cesium.

19. The method of claim 16, wherein said doped carbonaceous material comprises a carbonaceous material doped with urea $(NH_2)_2CO$.

20. The method of claim 16, wherein said doped carbonaceous material comprises a doped carbonaceous material comprising geometric discontinuities exhibiting radii of curvature of less than 1000 Å.

* * * * *